United States Patent
Chen et al.

(10) Patent No.: US 10,312,084 B2
(45) Date of Patent: Jun. 4, 2019

(54) SEMICONDUCTOR DEVICE AND FABRICATION METHOD THEREOF

(71) Applicant: UNITED MICROELECTRONICS CORP., Hsin-Chu (TW)

(72) Inventors: Kuang-Hsiu Chen, Tainan (TW); Yi-Liang Ye, Kaohsiung (TW); Chueh-Yang Liu, Tainan (TW); Yu-Ren Wang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 179 days.

(21) Appl. No.: 15/439,890

(22) Filed: Feb. 22, 2017

(65) Prior Publication Data

US 2017/0162389 A1 Jun. 8, 2017

Related U.S. Application Data

(62) Division of application No. 14/946,795, filed on Nov. 20, 2015, now Pat. No. 9,627,534.

(51) Int. Cl.
*H01L 21/265* (2006.01)
*H01L 21/02* (2006.01)
(Continued)

(52) U.S. Cl.
CPC .... *H01L 21/0335* (2013.01); *H01L 21/02521* (2013.01); *H01L 21/0332* (2013.01); *H01L 21/0337* (2013.01); *H01L 21/26513* (2013.01); *H01L 21/3105* (2013.01); *H01L 21/823814* (2013.01); *H01L 21/823864* (2013.01); *H01L 27/092* (2013.01); *H01L 29/0847* (2013.01); *H01L 29/24* (2013.01); *H01L 29/267* (2013.01); *H01L 29/517* (2013.01);
(Continued)

(58) Field of Classification Search
CPC ........... H01L 21/02521; H01L 21/0332; H01L 21/0335; H01L 21/0337; H01L 21/26513; H01L 21/823871; H01L 27/092; H01L 29/517; H01L 29/6656; H01L 29/7833; H01L 29/7848
See application file for complete search history.

(56) References Cited

U.S. PATENT DOCUMENTS 4,749,640 A * 6/1988 Tremont ........... H01L 21/02052
257/E21.008
5,567,244 A * 10/1996 Lee .......................... C01G 3/04
134/3

(Continued)

*Primary Examiner* — Joseph M Galvin, III
(74) *Attorney, Agent, or Firm* — Winston Hsu

(57) ABSTRACT

A method for fabricating the semiconductor device is disclosed. A semiconductor substrate having a main surface is provided. A gate is formed on the main surface of the semiconductor substrate. An offset liner is formed on the sidewall of the gate. An ion implantation process is performed to form lightly doped drain (LDD) region in the semiconductor substrate. A spacer is formed on a sidewall of the gate. A cavity is recessed into the main surface of the semiconductor substrate. The cavity is adjacent to the spacer. An epitaxial layer is grown in the cavity. The spacer is then subjected to a surface treatment to form a dense oxide film on the spacer. A mask layer is deposited on the dense oxide film. The dense oxide film has a thickness that is smaller or equal to 12 angstroms.

8 Claims, 4 Drawing Sheets

(51) Int. Cl.
*H01L 21/8238* (2006.01)
*H01L 21/033* (2006.01)
*H01L 29/78* (2006.01)
*H01L 29/08* (2006.01)
*H01L 29/267* (2006.01)
*H01L 29/51* (2006.01)
*H01L 29/66* (2006.01)
*H01L 29/24* (2006.01)
*H01L 21/3105* (2006.01)
*H01L 27/092* (2006.01)
*H01L 29/49* (2006.01)

(52) U.S. Cl.
CPC ........ *H01L 29/518* (2013.01); *H01L 29/6656* (2013.01); *H01L 29/6659* (2013.01); *H01L 29/66545* (2013.01); *H01L 29/66636* (2013.01); *H01L 29/7833* (2013.01); *H01L 29/7848* (2013.01); *H01L 21/823871* (2013.01); *H01L 29/4966* (2013.01)

(56) References Cited

U.S. PATENT DOCUMENTS

| | | | |
|---|---|---|---|
| 6,387,804 B1 * | 5/2002 | Foster | H01L 21/28518 257/E21.165 |
| 7,015,140 B2 * | 3/2006 | Arndt | H01L 21/28518 257/E21.165 |
| 8,652,917 B2 | 2/2014 | Lenski | |
| 8,765,546 B1 | 7/2014 | Hung | |
| 9,059,210 B2 | 6/2015 | Li | |
| 9,076,681 B2 | 7/2015 | Wu | |
| 9,209,272 B2 | 12/2015 | Liu | |
| 9,306,032 B2 | 4/2016 | Lin | |
| 9,368,592 B2 | 6/2016 | Li | |
| 2005/0189660 A1 | 9/2005 | Bu | |
| 2012/0068234 A1 | 3/2012 | Soss | |
| 2014/0027857 A1 | 1/2014 | Yin | |
| 2014/0199836 A1 | 7/2014 | Chen | |
| 2015/0128991 A1 * | 5/2015 | Brown | H01L 21/31133 134/1 |
| 2015/0137234 A1 | 5/2015 | Cheng | |
| 2015/0144159 A1 * | 5/2015 | Yu | H01L 21/67057 134/25.1 |
| 2015/0243526 A1 | 8/2015 | Hsiao | |
| 2015/0243544 A1 | 8/2015 | Alptekin | |
| 2015/0262823 A1 | 9/2015 | Hung | |
| 2015/0279838 A1 | 10/2015 | Tsao | |
| 2015/0287834 A1 | 10/2015 | Liao | |
| 2015/0311296 A1 | 10/2015 | Wu | |
| 2015/0318213 A1 | 11/2015 | Tsai | |
| 2015/0380305 A1 | 12/2015 | Basker | |
| 2015/0380412 A1 | 12/2015 | Huang | |
| 2016/0035856 A1 | 2/2016 | van Bentum | |
| 2016/0064518 A1 | 3/2016 | Liu | |
| 2016/0086856 A1 | 3/2016 | Yen | |
| 2016/0126102 A1 | 5/2016 | Chang | |
| 2016/0149017 A1 * | 5/2016 | Tsai | H01L 29/66636 257/288 |
| 2016/0268203 A1 | 9/2016 | Lu | |
| 2016/0276159 A1 | 9/2016 | Chuang | |
| 2016/0293725 A1 | 10/2016 | Liou | |
| 2016/0336412 A1 | 11/2016 | Hung | |

* cited by examiner

SEMICONDUCTOR DEVICE AND FABRICATION METHOD THEREOF

CROSS REFERENCE TO RELATED APPLICATIONS

This application is a division of U.S. application Ser. No. 14/946,795 filed Nov. 20, 2015, which is included herein in its entirety by reference.

BACKGROUND OF THE INVENTION

1. Field of the Invention

The present invention relates to the manufacture of semiconductor devices, and more specifically, to an improved dual epitaxial process for semiconductor MOS devices.

2. Description of the Prior Art

As known in the art, metal-oxide-semiconductor field-effect transistors (MOSFETs) have been scaled down through various technology nodes. To enhance carrier mobility and improve device performance, strained source/drain features (e.g., stressor regions) have been introduced. Stress distorts or strains the semiconductor crystal lattice, which affects the band alignment and charge transport properties of the semiconductor.

Typically, compressive strain increases charge carrier mobility in a p-type metal-oxide-semiconductor field-effect transistor (pMOSFET) channel and tensile strain increases charge carrier mobility in an n-type metal-oxide semiconductor field-effect transistor (nMOSFET) channel. Silicon-germanium (SiGe) is a typical epitaxial material utilized to induce compressive strain in pMOS channel for increased hole mobility. Tensile strain may be achieved for increased electron mobility in nMOS channel by the introduction of silicon carbide (SiC) or silicon phosphate (SiP).

However, the prior art dual epitaxial process for semiconductor MOS devices suffers from selective loss defect and SiGe fall-on issue (i.e. SiGe grains grown in nMOS region). It is therefore desirable to have improved methods and structures for utilizing such epitaxial material regions.

SUMMARY OF THE INVENTION

It is one objective of the invention to provide an improved semiconductor MOS device and an improved dual epitaxial process for fabricating such semiconductor MOS device, in order to solve the above-mentioned prior art problems and shortcomings.

In one aspect of the invention, a semiconductor device is disclosed. The semiconductor device includes a semiconductor substrate, an inter-layer dielectric (ILD) layer on the semiconductor substrate, a gate in the ILD layer, an offset liner on a sidewall of the gate, a spacer on the offset liner, a dense oxide film on the spacer, a contact etch stop layer on the dense oxide film, and a contact plug adjacent to the contact etch stop layer. The semiconductor device further includes a source region in the semiconductor substrate and a drain region spaced apart from the source region. A channel is located between the source region and the drain region. The dense oxide film has a thickness that is smaller or equal to 12 angstroms.

According to one embodiment, the semiconductor device is an n-type metal-oxide-semiconductor field-effect transistor (nMOSFET) and a SiP epitaxial layer is disposed either in the source region or in the drain region. The offset liner comprises carbon and nitrogen doped silicon oxide. The spacer comprises carbon and nitrogen doped silicon oxide.

In another aspect of the invention, a method for fabricating the semiconductor device is disclosed. A semiconductor substrate having a main surface is provided. A gate is formed on the main surface of the semiconductor substrate. An offset liner is formed on the sidewall of the gate. An ion implantation process is performed to form lightly doped drain (LDD) region in the semiconductor substrate. A spacer is formed on a sidewall of the gate. A cavity is recessed into the main surface of the semiconductor substrate. The cavity is adjacent to the spacer. An epitaxial layer is grown in the cavity. The spacer is then subjected to a surface treatment to form a dense oxide film on the spacer. A mask layer is deposited on the dense oxide film. The dense oxide film has a thickness that is smaller or equal to 12 angstroms.

According to one embodiment, the surface treatment includes: (a) making the spacer contact with diluted HF; (b) making the spacer contact with sulfuric acid and hydrogen peroxide mixture (SPM) solution; and (c) making the spacer contact with ozone water.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 1 to FIG. 6 are schematic, cross-sectional diagrams showing a method for fabricating a semiconductor MOS device according to one embodiment of the invention, wherein:

FIG. 1 to FIG. 5 illustrate an exemplary dual epitaxial process for forming the semiconductor MOS device;

FIG. 6 illustrates an exemplary cross-sectional view of the semiconductor MOS device after CESL and ILD deposition.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description is, therefore, not to be taken in a limiting sense, and the scope of the present invention is defined only by the appended claims, along with the full scope of equivalents to which such claims are entitled.

Figure 1:
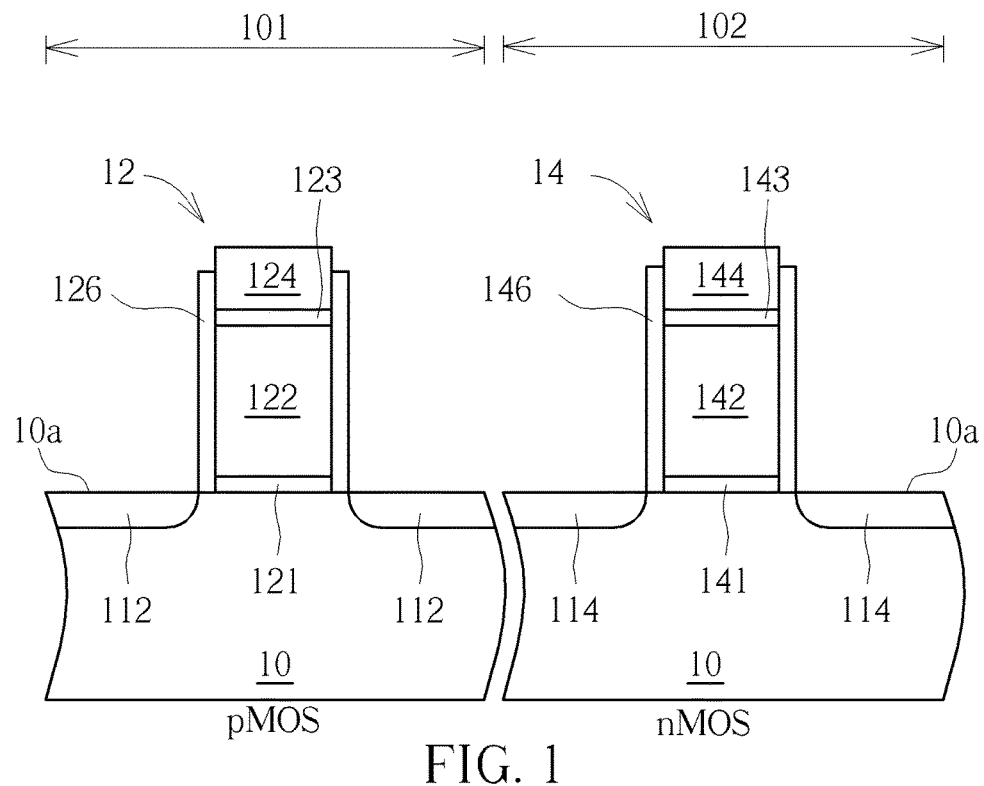

FIG. 1 to FIG. 6 are schematic, cross-sectional diagrams showing a method for fabricating a semiconductor MOS device according to one embodiment of the invention. As shown in FIG. 1, a semiconductor substrate 10 is provided. For example, the semiconductor substrate 10 may comprise a silicon substrate or a silicon-on-insulator (SOI) substrate, but is not limited thereto. For the sake of simplicity, only two regions: a pMOS region 101 and an nMOS region 102 are shown in the figures. The isolation regions such as shallow trench isolation (STI) regions for defining active areas are not shown. Suitable ion wells such as P wells or N wells may be formed in the semiconductor substrate 10, which are also not shown in the figures.

The semiconductor substrate 10 has a main surface 10a. A gate 12 and a gate 14, for example, both are a polysilicon gate, are formed on the main surface 10a of the semiconductor substrate 10 in the pMOS region 101 and the nMOS region 102, respectively. According to one embodiment, the gate 12 and the gate 14 may be dummy poly gates, and may be replaced with high k dielectric and metal gates in a later manufacturing stage.

According to one embodiment, the gate 12 may include, but not limited to, a gate oxide layer 121, a polysilicon layer 122 on the gate oxide layer 121, a thin silicon nitride layer 123 on the polysilicon layer 122, and a hard mask oxide layer 124 on the thin silicon nitride layer 123. According to one embodiment, the gate 14 may include, but not limited to, a gate oxide layer 141, a polysilicon layer 142 on the gate oxide layer 141, a thin silicon nitride layer 143 on the polysilicon layer 142, and a hard mask oxide layer 144 on the thin silicon nitride layer 143. It is understood that the shown layers of the gates 12 and 14 are for illustration purposes only. It is understood that other layers or materials may be employed in the gates 12 and 14.

Still referring to FIG. 1, subsequently, an offset liner 126 is formed on the sidewall of the gate 12 and an offset liner 146 is formed on the sidewall of the gate 14. According to one embodiment, the offset liners 126 and 146 may comprise carbon and nitrogen doped silicon oxide (SiOCN). After forming the offset liners 126 and 146, an ion implantation process is performed to form lightly doped drain (LDD) regions 112 in the semiconductor substrate 10 in the pMOS region 101, and an ion implantation process is performed to form LDD regions 114 in the semiconductor substrate 10 in the nMOS region 102.

Figure 2:
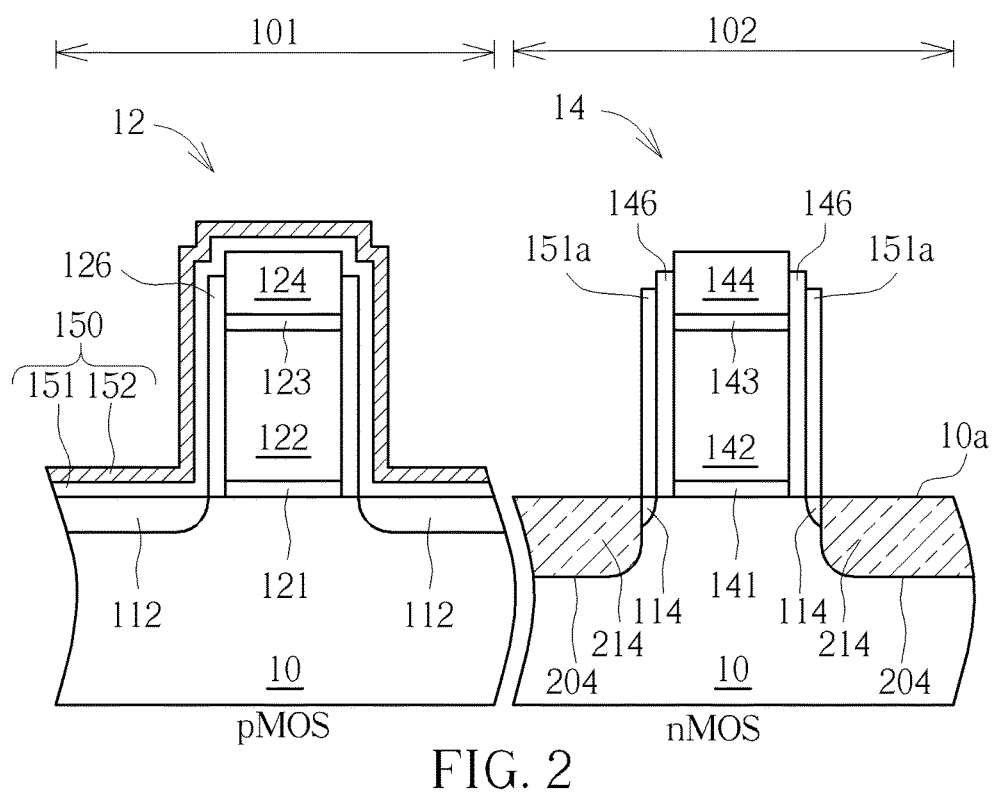

As shown in FIG. 2, subsequently, a SiP epitaxial growth process is performed to form SiP epitaxial layer in the nMOS region 102. For example, the pMOS region 101 is covered with a mask layer 150. The mask layer 150 may be a composite layer comprising, for example, a first dielectric layer 151 and a second dielectric layer 152, but is not limited thereto. According to one embodiment, the first dielectric layer 151 may comprise SiOCN. According to one embodiment, the second dielectric layer 152 may comprise silicon nitride, for example, a silicon-rich silicon nitride layer. A spacer 151a is formed on the sidewall of the gate 14 in the nMOS region 102. According to one embodiment, the spacer 151a may comprise SiOCN.

The first dielectric layer 151 and the second dielectric layer 152 may be formed by using chemical vapor deposition (CVD) methods, for example, Low-Pressure CVD (LPCVD), Plasma-Enhanced CVD (PECVD), or Atomic Layer Deposition (ALD), but is not limited thereto.

After forming the spacer 151a on the sidewall of the gate 14 in the nMOS region 102, an etching process such as a dry etching process is performed to etch the semiconductor substrate 10 thereby forming a cavity 204 on each side of the gate 14. The cavity 204 is recessed into the main surface 10a of the semiconductor substrate 10 and is adjacent to the spacer 151a. An epitaxial growth process is then performed to grow a first epitaxial layer 214 such as SiP in the cavity 204.

Figure 3:
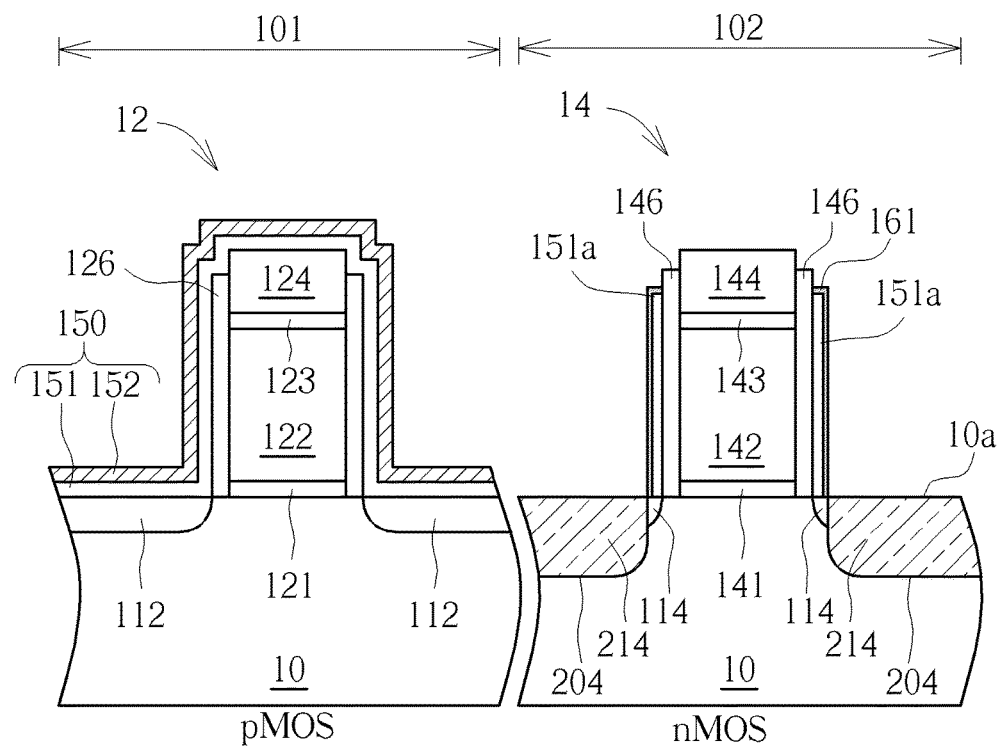

As shown in FIG. 3, after forming the first epitaxial layer 214 in the nMOS region 102, the spacer 151a is subjected to a surface treatment to form a dense oxide film 161 on the spacer 151a. The dense oxide film 161 may be a densified silicon oxide film. According to one embodiment, the dense oxide film 161 has a thickness that is smaller or equal to 12 angstroms.

According to one embodiment, the surface treatment includes the following sequence: (a) making the spacer 151a contact with diluted HF; (b) making the spacer 151a contact with sulfuric acid and hydrogen peroxide mixture (SPM) solution; and (c) making the spacer 151a contact with ozone water. According to one embodiment, the surface treatment may be carried out at room temperature, but is not limited thereto.

The diluted HF may create highly active dangling bonds on the surface of the spacer 151a. By contacting with the SPM solution, the highly active dangling bonds may be transformed into chemical Si—O bonding. The subsequent ozone water treatment makes the chemical silicon oxide become more compact and also repairs the interface between the dense oxide film 161 and the spacer 151a. The dense oxide film 161 is formed only in the nMOS region 102 because the MOS region 101 is still covered with the mask layer 150 when performing the surface treatment.

Figure 4:
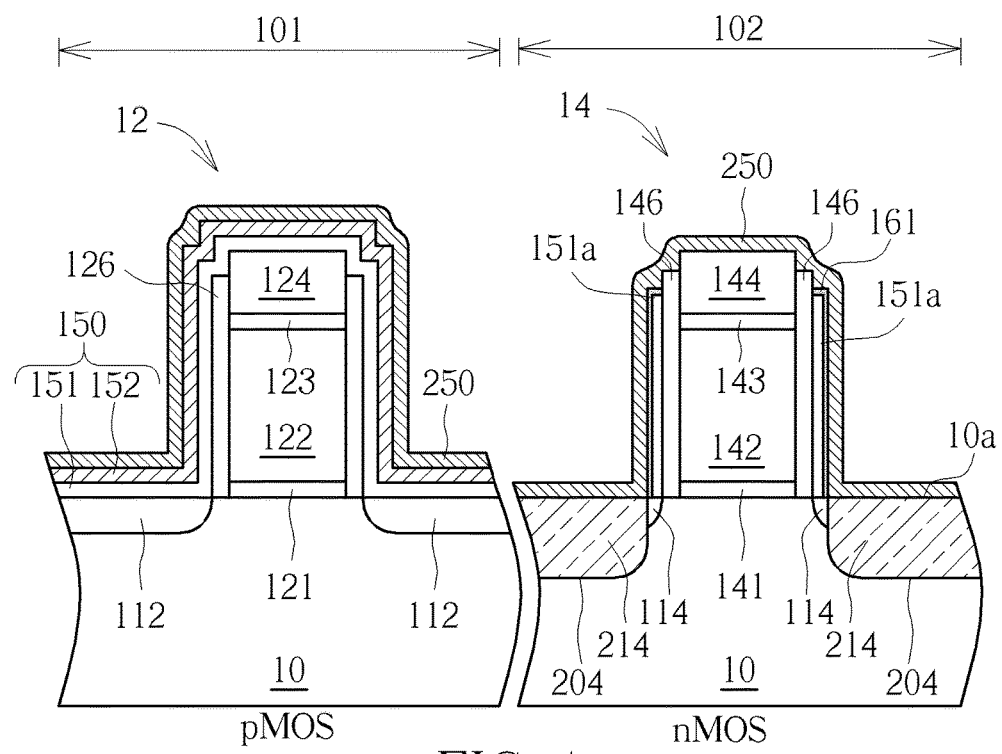

As shown in FIG. 4, a mask layer 250 such as a silicon-rich silicon nitride layer is deposited in a blanket fashion. The mask layer 250 conformally covers the pMOS region 101 and the nMOS region 102. In the pMOS region 101, the mask layer 250 is deposited directly on the mask layer 150 and is in direct contact with the second dielectric layer 152. In the nMOS region 102, the mask layer 250 is in direct contact with the dense oxide film 161, the first epitaxial layer 214, and the hard mask oxide layer 144. The mask layer 250 such as a silicon-rich silicon nitride layer may be deposited by using an ALD process including a plurality of ALD cycles. The dense oxide film 161 on the spacer 151a helps to deposit a high-quality, highly uniform silicon nitride film at the first 15-20 ALD cycles during the aforesaid ALD process.

Figure 5:
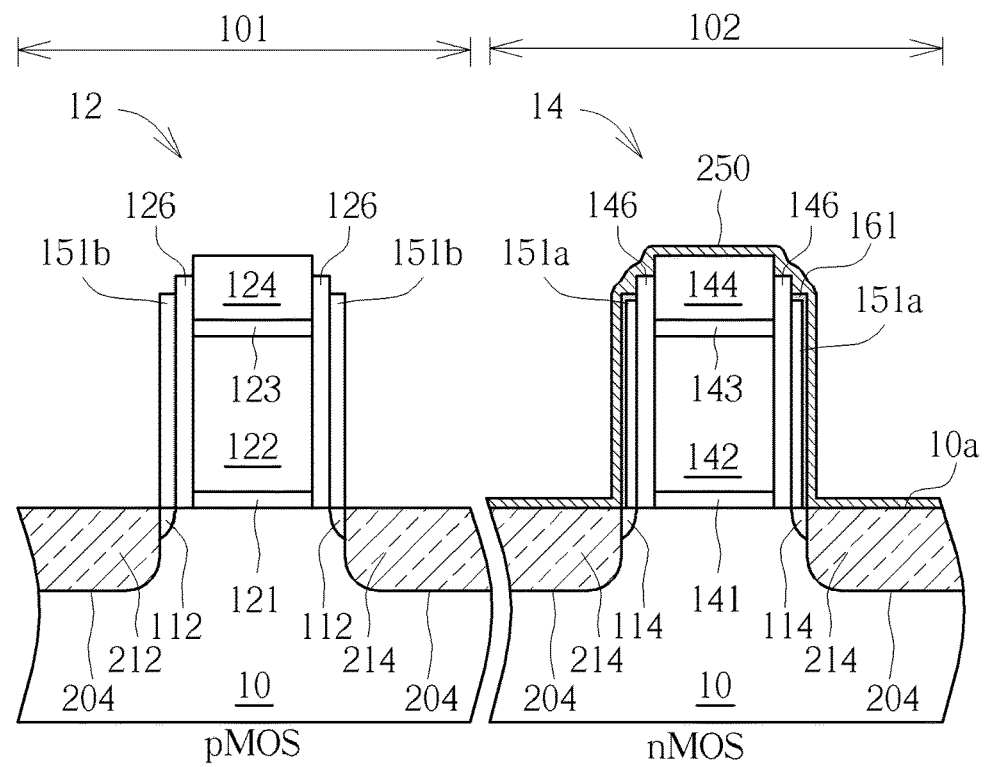

As shown in FIG. 5, subsequently, the nMOS region 102 may be covered with a resist layer (not shown) such as a photoresist layer and the mask layer 250 in the pMOS region 101 is exposed. The exposed mask layer 250 is then removed from the pMOS region 101. A dry etching process is then performed to etch the semiconductor substrate 10 thereby forming a cavity 202 on each side of the gate 12 and a spacer 151b on the sidewall of the gate 12. The cavity 202 is recessed into the main surface 10a of the semiconductor substrate 10 and is adjacent to the spacer 151b. The resist layer (not shown) in the nMOS region 102 is then removed.

Subsequently, a pre-clean process may be performed. The pre-clean process may use either an aqueous solution of hydrogen fluoride (HF), or a gas phase HF to remove the surface defects or contaminations, but is not limited thereto. Other pre-clean methods may be employed. After the pre-clean process, the remaining thickness of the mask layer 250 in the nMOS region 102 may be equal to or less than 20 angstroms. An epitaxial growth process is then performed to grow a second epitaxial layer 212 such as SiGe in the cavity 202. Since the remaining mask layer 250 comprises high-quality ALD deposited Si-rich silicon nitride, the SiGe growth in the nMOS region 102 may be avoided.

Figure 6:
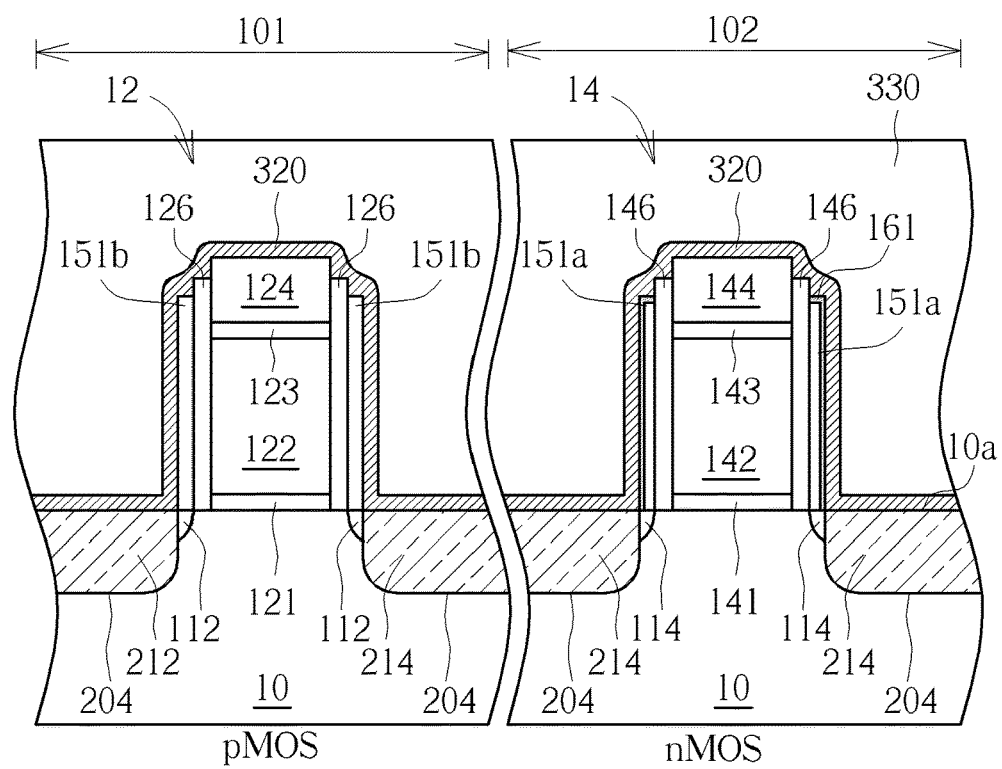

As shown in FIG. 6, after the dual epitaxial process as set forth through FIG. 1 to FIG. 5, a typical high-k/metal gate (HK/MG) process may be performed to form the semiconductor MOS devices 2 and 4 in the pMOS region 101 and nMOS region 102, respectively. First, for example, the remaining mask layer 250 may be removed from the nMOS region 102. When removing the remaining mask layer 250, the dense oxide film 161 may function as a protection layer or a stop layer that protects the integrity of the underlying spacer 151a. Subsequently, a contact etch stop layer (CESL) 320 such as a silicon nitride layer and an inter-layer dielectric (ILD) layer 330 such as a silicon oxide layer may be deposited in a blanket fashion.

Figure 7:
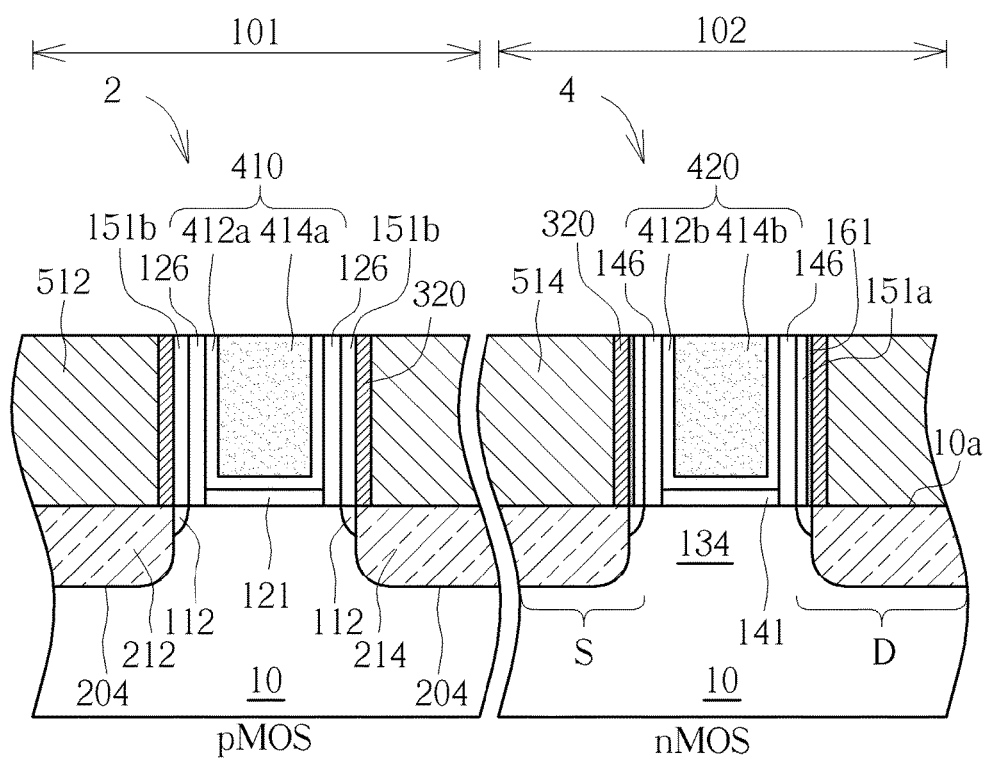
FIG. 7 illustrates an exemplary cross-sectional view of the semiconductor MOS device after high-k/metal gate (HK/MG) process and contact formation.

As shown in FIG. 7, a chemical mechanical polishing (CMP) process may be performed to remove an upper portion of the ILD layer 330, a portion of the CESL 320, a portion of the spacer 151a, a portion of the spacer 151b, a portion of the offset spacer 126, a portion of the offset spacer 146, the hard mask oxide layer 124, the hard mask oxide layer 144, the thin silicon nitride layer 123, and the thin silicon nitride layer 143, thereby exposing a top surface of the polysilicon layer 122 and a top surface of the polysilicon layer 142. Thereafter, the polysilicon layers 122 and 142 are removed to form gate trenches. Subsequently, replacement gate structures 410 and 420 may be formed within the gate trenches in the pMOS region 101 and nMOS region 102, respectively. The replacement gate structure 410 may comprise a high-k dielectric layer 412a and a metal gate 414a. The replacement gate structure 420 may comprise a high-k dielectric layer 412b and a metal gate 414b.

According to one embodiment, for example, the metal gates 414a, 414b may comprise at least a metal film including, but not limited to, tantalum nitride (TaN) or titanium nitride (TiN), titanium carbide (TiC), tantalum carbide (TaC), tungsten carbide (WC), titanium aluminide (TiAl), aluminum titanium nitride (TiAlN), aluminum, tungsten, titanium aluminum alloy (TiAl), cobalt tungsten phosphide (CoWP).

According to one embodiment, for example, the high-k dielectric layers 412a, 412b may comprise hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), or barium strontium titanate ($Ba_xSr_{1-x}TiO_3$, BST).

After forming the high-k dielectric layers 412a, 412b and metal gates 414a, 414b, contact plugs 512 and 514 are formed in the ILD layer. The contact plugs 512 and 514 may be referred to as M0 contact. Optionally, a dielectric layer (not shown) may be deposited in a blanket fashion before the contact plugs 512 and 514 are formed. The contact plugs 512 and 514 may be in direct contact with the CESL 320 in the pMOS region 101 and nMOS region 102, respectively.

Still referring to FIG. 7, the present invention in one aspect discloses a semiconductor MOS device 4. According to one embodiment, the semiconductor MOS device 4 is an n-type metal-oxide-semiconductor field-effect transistor (nMOSFET) device. The semiconductor MOS device 4 includes a semiconductor substrate 10, an inter-layer dielectric (ILD) layer 330 (shown in FIG. 6) on the substrate 10, a gate 420 in the ILD layer 330, an offset liner 146 on a sidewall of the gate 420, a spacer 151a on the offset liner 146, a dense oxide film 161 on the spacer 151a, a contact etch stop layer 320 on the dense oxide film 161, and a contact plug 514 adjacent to the contact etch stop layer 320. The contact etch stop layer 320 is in direct contact with the dense oxide film 161.

The semiconductor MOS device 4 further includes a source region S in the semiconductor substrate 10 and a drain region D spaced apart from the source region S. A channel 134 is located between the source region S and the drain region D. The dense oxide film 161 has a thickness that is smaller or equal to 12 angstroms.

According to one embodiment, a SiP epitaxial layer 214 is disposed either in the source region S or in the drain region D. The offset liner 146 comprises carbon and nitrogen doped silicon oxide. The spacer 151a comprises carbon and nitrogen doped silicon oxide.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor device, comprising:
   providing a semiconductor substrate having a main surface;
   forming a gate on the main surface of the semiconductor substrate;
   forming a spacer on a sidewall of the gate;
   forming a cavity recessed into the main surface of the semiconductor substrate, wherein the cavity is adjacent to the spacer;
   growing an epitaxial layer in the cavity;
   after growing the epitaxial layer in the cavity, forming a densified silicon oxide film on the spacer; and
   depositing a mask layer on the densified silicon oxide film.

2. The method for fabricating a semiconductor device of claim 1, wherein the gate is a polysilicon gate.

3. The method for fabricating a semiconductor device of claim 1, wherein before forming the spacer, the method further comprises:
   forming an offset liner on the sidewall of the gate; and
   performing an ion implantation process to form lightly doped drain (LDD) region in the semiconductor substrate.

4. The method for fabricating a semiconductor device of claim 3, wherein the offset liner comprises carbon and nitrogen doped silicon oxide.

5. The method for fabricating a semiconductor device of claim 4, wherein the spacer comprises carbon and nitrogen doped silicon oxide.

6. The method for fabricating a semiconductor device of claim 1, wherein the said forming a densified silicon oxide film on the spacer comprises:
   contacting the spacer with diluted HF;
   contacting the spacer with sulfuric acid and hydrogen peroxide mixture (SPM) solution; and
   contacting the spacer with ozone water.

7. The method for fabricating a semiconductor device of claim 1, wherein the densified silicon oxide film has a thickness that is smaller or equal to 12 angstroms.

8. The method for fabricating a semiconductor device of claim 1, wherein the mask layer comprises silicon-rich silicon nitride.

* * * * *